United States Patent

Balan

Patent Number: 5,063,475
Date of Patent: Nov. 5, 1991

[54] MULTILEVELED ELECTRONIC ASSEMBLY WITH COOLING MEANS

[75] Inventor: Albert L. Balan, Endwell, N.Y.

[73] Assignee: International Business Machines Corporation, Armonk, N.Y.

[21] Appl. No.: 495,863

[22] Filed: Mar. 19, 1990

[51] Int. Cl.$^5$ .............................................. H05K 7/20
[52] U.S. Cl. .................... 361/384; 361/382; 361/383; 361/385; 165/80.3; 174/15.1
[58] Field of Search ............... 361/382, 383, 384, 385; 165/80.3, 104.33, 903, 125; 174/15.1, 16.1

[56] References Cited

U.S. PATENT DOCUMENTS

| | | | |
|---|---|---|---|
| 3,434,014 | 3/1989 | Taynton | 317/99 |
| 4,335,781 | 6/1982 | Duffy | 165/11 |
| 4,417,295 | 11/1983 | Stuckert | 361/384 |
| 4,502,100 | 2/1985 | Greenspan | 361/384 |
| 4,590,538 | 5/1986 | Cray, Jr. | 361/385 |
| 4,633,371 | 12/1986 | Nagy et al. | 361/385 |
| 4,733,293 | 3/1988 | Gabuzda | 357/81 |
| 4,894,749 | 1/1990 | Elko et al. | 361/383 |

OTHER PUBLICATIONS

IBM TDB, vol. 14, No. 2, Jul. 1971, p. 468, Central Air Cooling System.
IBM TDB, vol. 19, No. 2, May 1977, pp. 4489-4490, Multilayer Electronics Package.
IBM TDB, vol. 31, No. 5, Oct. 1988, pp. 44-47, Forced Convection Downward Flow Cooling System.

Primary Examiner—Gerald P. Tolin
Assistant Examiner—Young S. Whang
Attorney, Agent, or Firm—Lawrence R. Fraley

[57] ABSTRACT

An electronic assembly (e.g., a supercomputer) wherein different levels of substrates, each having a plurality of heat-generating electronic components (e.g., resistors, capacitors, power supplies, VLSI modules) thereon, is described. The assembly includes a cooling structure centrally disposed therein for providing cooling fluid to each of the heat generating components to cool same. In a preferred embodiment, the cooling structure comprises a plurality of concentrically disposed duct members (e.g., of thermoplastic), which each in turn include a longitudinal chamber portion and a flared end portion. The flared end portion is particularly designed to direct the cooling fluid in a plurality of directions, depending on the requirements of the assembly. Diffusing structure (e.g., an apertured plate) may also be used to assure passage of turbulent, even fluid flow through each duct member.

19 Claims, 8 Drawing Sheets

MULTILEVELED ELECTRONIC ASSEMBLY WITH COOLING MEANS

TECHNICAL FIELD

This invention relates to cooling systems for use in electronic assemblies and particularly for use in such assemblies as used in information handling systems (computers). As will be understood from the following, the invention is also useable in such systems currently being referred to in the art as supercomputers.

BACKGROUND OF THE INVENTION

Effective removal of heat generated by various electronic components which form part of an electronic assembly such as a computer is critical in order for the assembly to operate in a satisfactory manner. In many of today's computers, circuit and component miniaturization efforts have successfully resulted in the reduction of the amount of heat generated by such circuit components and subcircuit assemblies. However, concurrent with such reduction in heat generation per component has been an increasing desire to significantly increase packaging densities, the overall result being that the total amount of heat being generated per unit area has not significantly decreased. And, in the case of supercomputers, wherein maximum densities are essential, extraordinarily high levels of heat generation are being experienced. By the term supercomputer as used herein is meant to define a high speed, high capacity information handling system wherein power levels within the range of about 50,000 to about 100,000 watts are utilized, such systems generating upwards of approximately 7,000 BTU's per minute of heat during normal operation. The processing capabilities of such systems may be within the range of about 150 to about 18,000 megaflops (millions of basic floating point operations per second). It is to be understood that the teachings of this invention are not limited to supercomputers as described above but that the cooling system as defined herein may be used satisfactorily in many various types of electronic assemblies, including computers having significantly less processing capabilities (e.g., about 5000 to 50,000 watts) than cited above. Equally significant, the invention may also find usage in information handling systems possessing greater capabilities than described for the supercomputers mentioned above, particularly if such computers are of the multileveled type having substrates and components located at separate levels within the computer's housing structure.

Various techniques have been employed to provide cooling to electronic components within a computer, including forced air through the computer's console to the use of liquid or refrigerant filled cold bars or cold plate chassis members wherein such fluids as fluorocarbon products are circulated. Such liquids may be obtained having different boiling points, depending on the operational requirements of the system being cooled. Immersion cooling has also been employed in some known computer systems and is considered to have some advantages over regular air cooling due to higher heat transfer rates and the higher heat capacity of the liquid in comparison to that of a gas.

In the case of forced air systems, hot spots have still resulted which in turn have required rather sophisticated console interior layouts and/or geometries of the system's components. On many occasions in such designs, the cabinet structure formed part of the air directional and containment means which meant that, once the cabinet's door was opened (e.g., to effect component or card repair and/or replacement), the effectiveness of the cooling means was substantially reduced. In cooling systems which utilize cooling bars and cold plate chassis members (e.g., wherein heat generated by components mounted on a circuit board or card is transmitted by convection and conduction to cold plates and then to cold bars, these refrigerant cooled bars possibly having some means for receiving the edges of the plates to which the cards may be mounted), such systems have proven insufficient for effectively removing heat in high density electronic assemblies having heat generation levels and operational wattages such as mentioned above. Finally, in the case of immersion type cooling systems, such systems mandate the provision of relatively complicated electrical and mechanical constructions in order to assure effective access (e.g., for servicing and/or updates) to the system.

The cooling means as defined herein below is capable of providing effective cooling of electronic components located within an electronic assembly, including one of the supercomputer variety, without possessing several of the drawbacks associated with systems such as defined above. As will be defined, the cooling means of the instant invention is capable of doing so in a sound, effective manner. Although the invention as described is particularly adaptable for use with air or other gas forms of coolants, it is understood that the invention is also capable of utilization with liquid types of coolants, such as fluorocarbons. The invention will thus be defined as a fluid cooling means, the term fluid meaning to include both gases and liquids.

It is believed that an electronic assembly including such a cooling means will constitute a significant advancement in the art.

DISCLOSURE OF THE INVENTION

Accordingly, it is an object of this invention to provide an improved electronic assembly wherein effective cooling of the heat generating components which form part thereof is made possible in a sound, effective manner.

It is another object of the invention to provide such an assembly wherein such a cooling means is of relatively simple construction and is thus relatively easy to operate.

It is still another object of the invention to provide such an assembly wherein the assembly does not possess the aforementioned disadvantages associated with many existing assemblies.

It is a further object of the invention to provide such an assembly which can form part of a supercomputer.

The above and other objects are accomplished by the provision of an electronic assembly comprised of a plurality of different levels each having a substrate as part thereof with each substrate including thereon a plurality of heat generating components. The assembly includes a cooling means which in turn comprises a plurality of individual duct members oriented within the assembly, each duct directing cooling fluid onto the electronic components of a respective one of the substrates in order to cool said components.

BEST MODE FOR CARRYING OUT THE INVENTION

For a better understanding of the present invention, together with other and further objects, advantages and capabilities thereof, reference is made to the following disclosure and appended claims in connection with the above described drawings.

In FIGS. 1-4, there is shown a multi-leveled electronic assembly 11 in accordance with a preferred embodiment of the invention. As indicated above, assembly 11 is preferably one for use in information handling systems (computers) and, even more particularly, for use in such systems currently referred to in the technology as supercomputers. As such, these assemblies generate extraordinarily large quantities of heat which must be effectively removed in order for proper operation of the assembly to occur. That is, the several heat generating electronic components used in assemblies such as supercomputers are known to generate large quantities of heat during operation due, primarily, to the passage of high electrical currents therethrough. While recent technology has resulted in the development of heat generating components (e.g., capacitors, power supplies, resistors, very large scale integrated (VLSI) modules) which satisfactorily operate at reduced heat levels in comparison to their predecessors, the design requirements of many of todays' supercomputers and similar information handling systems stipulate that these components be placed in close proximity within the system (e.g., to reduce line connection length, assure compactness of design, etc.). The overall result of such requirements is that heat levels in such systems has remained relatively high.

As will be defined herein, the assembly 11 of the invention is able to provide positive cooling of electronic components located on various substrate levels within the invention in a simple but unique manner so that effective cooling of these components occurs. As will be defined, the cooling system of the invention is particularly adapted for the passage of air or other gaseous medium over the components being cooled, but this is not meant to limit the invention in that the cooling means of the invention is also readily capable of passing liquids or similar coolants (including flourocarbons) if desired.

In FIGS. 1-4, electronic assembly 11 is shown to include a plurality of spacedly positioned substrates 13. By the term substrate as used herein is meant to define an electrically insulative member having electrical wiring or similar circuitry therein and/or thereon and which is adaptable for having various electronic components (e.g., capacitors, modules, resistors) mounted thereon. Examples of such substrates include ceramic structures and known printed circuit board structures (e.g., those including a plurality of individual levels of circuit and power planes as part thereof). Such multilayered circuit boards and ceramic substrates are well known in the art and further description is not believed necessary. These substrates may be located on tray or similar supporting members e.g., tray 92 in FIG. 9, or, instead serve as the support structure itself and thus not include added supportive or the like structure thereunder.

Figure 1:
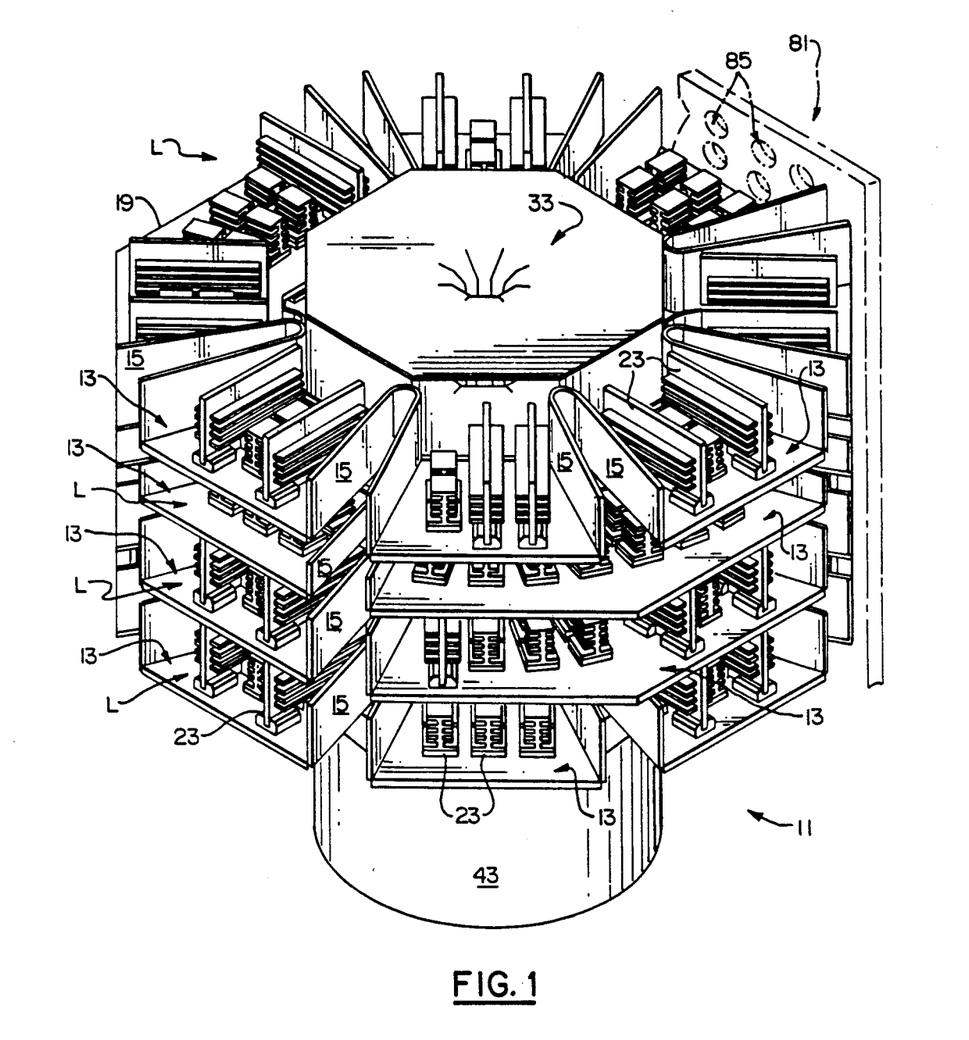
FIG. 1 is a front perspective view of a polygonal shaped electronic assembly in accordance with one embodiment of the invention, the assembly shown as including a cooling means centrally disposed therein in order to provide cooling of the several individual levels of substrates which form part of the assembly and which each include thereon heat generating electronic components.
Figure 2:
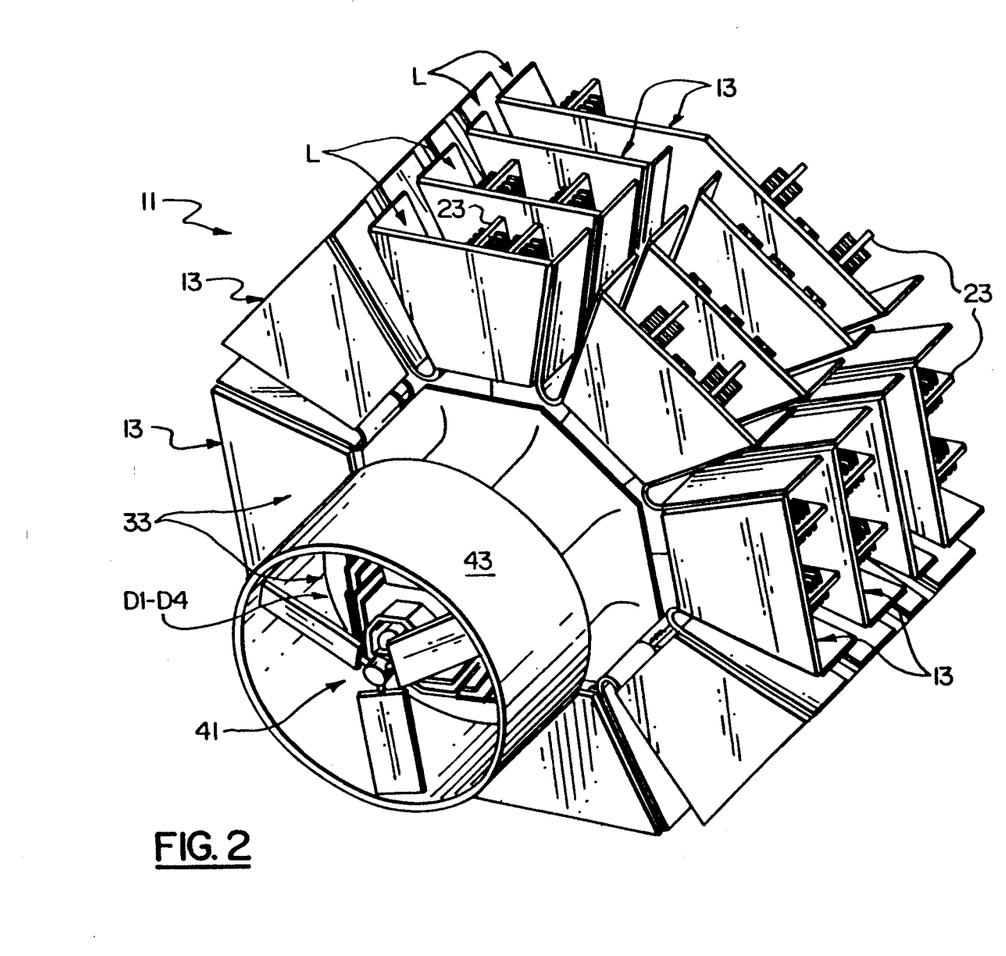
FIG. 2 is a bottom perspective view of the assembly of FIG. 1, more clearly illustrating the plenum and fan assembly located within the plenum.
Figure 4:
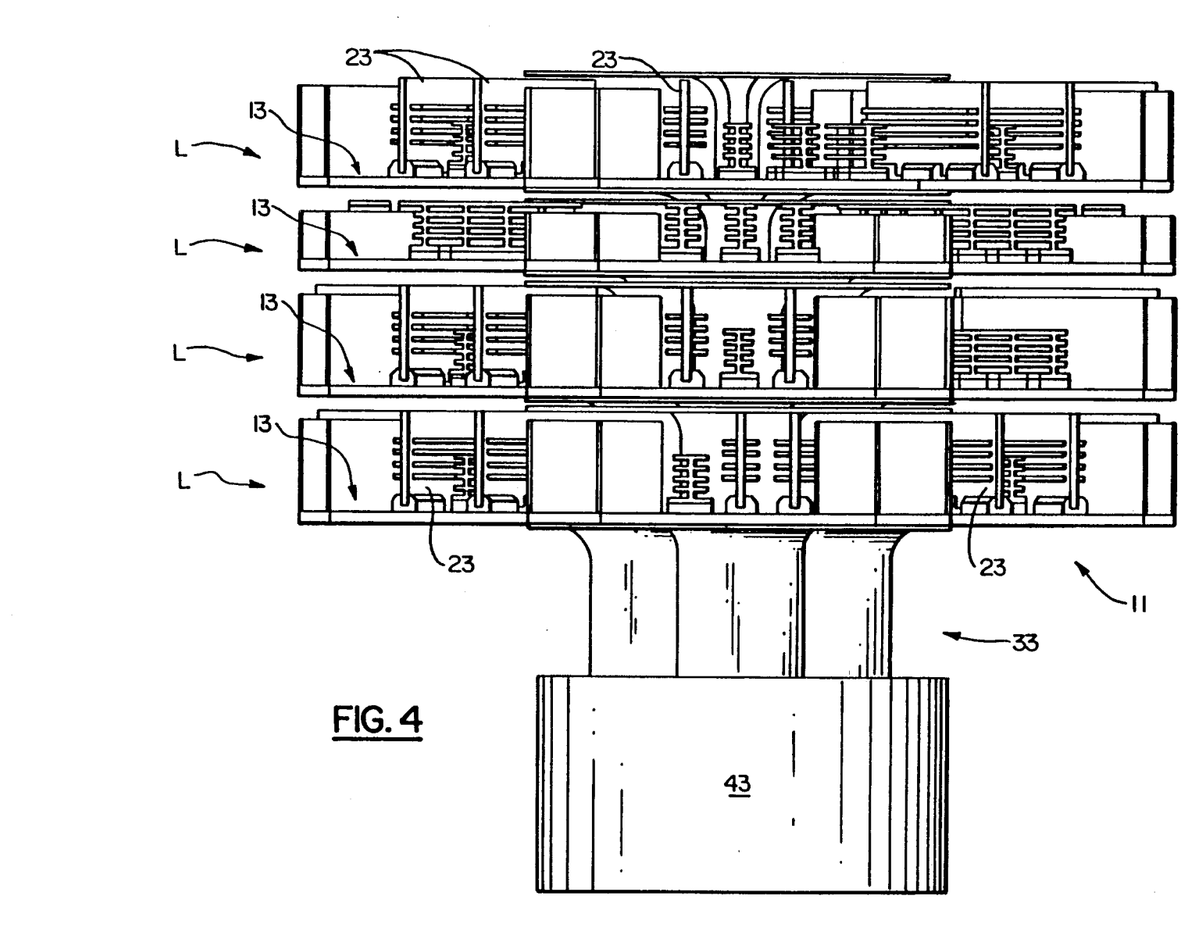
FIG. 4 is a side elevational view of the assembly of FIG. 1.

As shown in FIGS. 1, 2 and 4, these substrates 13 are located at various levels within assembly 11. With particular attention to FIG. 4., four levels "L" are clearly depicted in elevation. As more clearly shown in FIG. 4, these levels may not be equally spaced from each other in assembly 11 such that the respective coolant receiving "chambers" above each substrate need not all be the same size. For example, those in the illustrated second level (from the top of assembly 11) are clearly smaller in overall volume than those in the other three levels.

Figure 3:
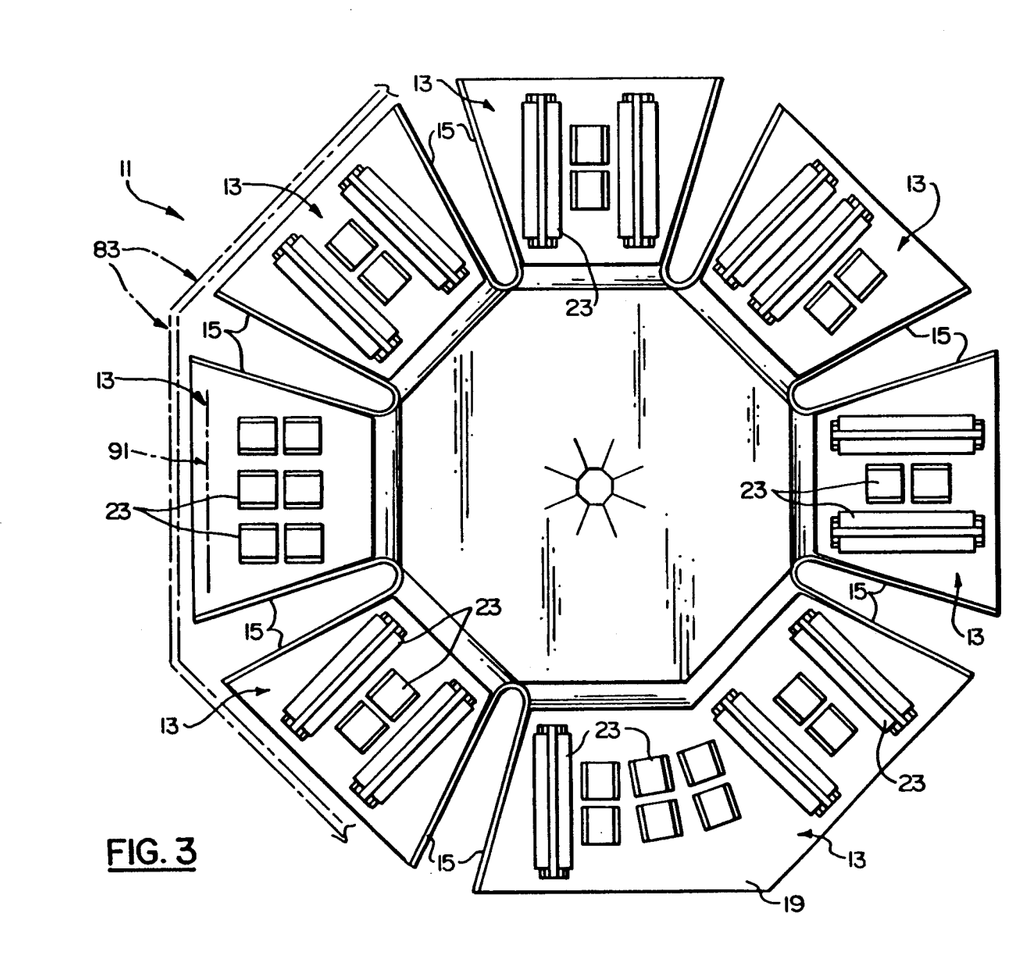
FIG. 3 is a top view of the polygonal shaped assembly of FIG. 1, further illustrating the various substrates (e.g., circuit cards) on the top level thereof and the components on each.

Each level "L" is shown to include a plurality of individual substrates 13, each of which have a plurality of heat generating components positioned thereon. As better seen in FIG. 3, one level "L" (the top level only as shown in FIG. 3) includes a total of seven individual substrates, each having side deflector walls 15 thereon. In the polygonal configuration of the invention as depicted in FIGS. 1-4, the number of sides is eight (assembly 11 thus being octagonal). However, this is not meant to limit the number of substrates, as indicated above wherein only seven such substrates may be used for this configuration. Thus, one or more substrates (e.g., 19) may in turn occupy more than one (substrate 19 in FIG. 3 occupying two) of the sides of assembly 11. This is considered an important feature of assembly 11 in that it results in a reduction of the total number of components required for the assembly. The remaining substrates shown in the top level of the assembly 11 in FIG. 3 may be to referred to as singular elements in that each occupies but one of the remaining sides of the assembly.

Figure 9:
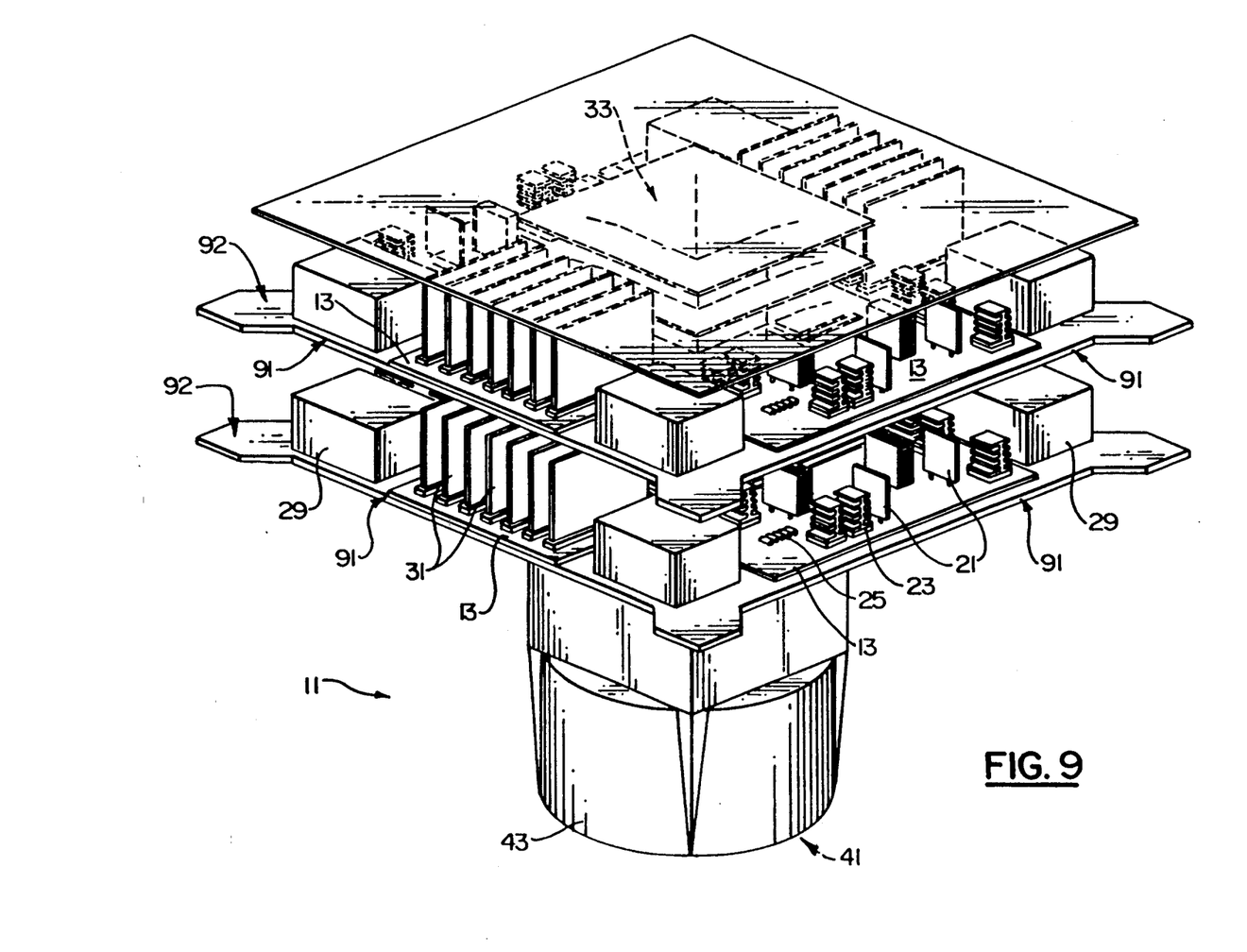

On each substrate is located a variety of heat generating electronic components which provide the necessary information handling functions for assembly 11. Such components may include capacitors 21 (FIG. 9), electronic modules 23 (typically including a heat sinking member as part thereof), resistors 25 (FIG. 9) and power supplies 29 (FIG. 9). Other electronic components, including pluggable printed circuit cards 31 or the like (FIG. 9) may also be used in assembly 11. The number, type and location of these components as shown in the drawings as not meant to limit the invention. Various other combinations, spacings, etc. are readily possible.

As shown in the drawings, each substrate forms a platform or the like and includes the desired heat generating electronic components positioned thereon in the manner prescribed by the system designer. The relative close proximity of such components is best seen in FIG. 1. As is understood, this close relationship will result in the generation of substantial quantities of heat by these components during operation of the invention and there is thus an essential need to cool such components in order to assure satisfactory operation of assembly 11. Failure to do so, understandably, may result in eventual destruction or partial inoperation of these components.

Figure 5:
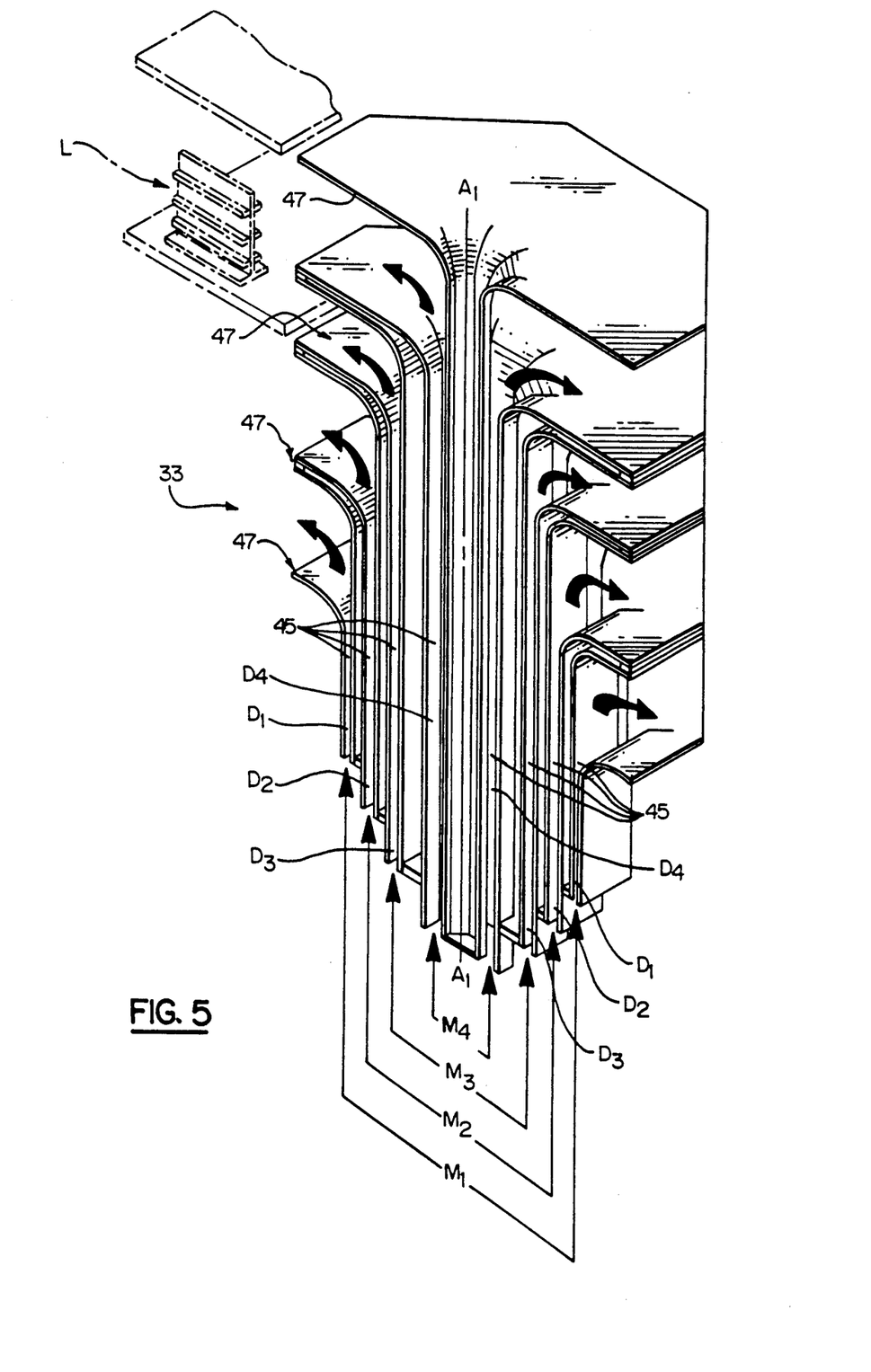
FIG. 5 is a partial view of the preferred cooling means of the invention as used within the assembly of FIG. 1, this cooling means shown as of a polygonal configuration but sectioned in half for illustration purposes.

To provide this cooling, assembly 11 includes a cooling means 33 centrally located therein (surrounded by the individual substrates 13). Cooling means 33 comprises a plurality of individual cooling ducts D1, D2, D3 and D4, each of these ducts interconnecting a respective one of the aforedefined substrate levels with a means for generating the flow of fluid within assembly 11. Such a means, as illustrated in FIG. 2, preferably comprises an electric fan 41 located within a plenum 43 which serves as a common housing for each of the individual duct members D1-D4. As is best shown in FIG. 5, each of the individual duct members of cooling means 33 includes a longitudinal chamber portion 45 which connects to a flared end portion 47 of curved configuration so as to direct the upwardly forced fluid (e.g., air) onto the adjacent electronic components on substrates 13. Each longitudinal chamber portion is of polygonal configuration thus possessing the same number of sides as mentioned above for assembly 11. Thus, in the embodiment of FIG. 5, each longitudinal chamber of each duct member possesses an octagonal configuration such that the fluid is directed in a total of eight directions when passed up through the towered structure. Thus, the internal walls of each duct are substantially parallel to the sides (outer) of the respective portion of the assembly into which it directs the cooling fluid.

As also shown in FIG. 5, the individual duct members are oriented in a coaxial orientation about a common axis A—A (FIG. 5) centrally disposed in a vertical manner within assembly 11. These concentrically oriented duct members D1-D4 are thus spacedly positioned about the common axis A—A and each are adapted for receiving fluid in the lower end portions thereof adjacent the source (fan 41). Each duct member thus includes its own mass flow rate M (lb./ft.$^3$), said flow rates indicated by the letters M1-M4 respectively in FIG. 5.

The thermal analysis or design of this cooling system, like that of many cooling systems, requires a determination of the cooling flow requirements, system impedance (resistance) and component temperatures. The required fluid flow rate can be determined from the equation that the rate is equal to the total heat to be dissipated divided by the product of the fluid density, fluid specific heat and fluid temperature rise.

The required flow rate to remove the power dissipation yields a desired temperature. This equation may be used to calculate the total volume of fluid required for the machine or individual components. In the instant situation, a calculation can be made for the flow rate required for each duct level. The total, M1, M2, M3, and M4, will equal the total for the entire machine. Hot spots on various components on different levels can be neutralized by baffles or similar members located at strategic locations on each level relative to the components having such hot spots.

The fluid flowing through a machine encounters flow resistance which is proportional to the square of the velocity. This resistance (or impedance), and the fan, having its own impedance value, must be satisfactorily matched to each other in order to provide a proper operating point for the overall system.

It is understood that the invention is not limited to only four individual levels "L" as depicted herein. That is, the cooling means as defined herein is readily capable of being used in electronic assemblies wherein other numbers of levels are utilized. It is preferred that one duct member be provided per level but this also is not meant to limit the invention in that more than one duct member may be used per individual level. This is represented in FIG. 5 wherein two duct members (D3 and D4) serve to direct fluid onto but a singular level (shown in phantom). This representation is for illustration purposes only in FIG. 5 to illustrate the possibility described. It is understood that the four leveled duct arrangement in FIG. 5 provides cooling fluid to four levels "L" in the embodiment of FIGS. 1–4.

In one embodiment of the invention, a combined mass flow (ft.$^3$/min.) within the range of from about 50 ft$^3$/min to about 450 ft$^3$/min is preferred when providing cooling fluid to a four tiered structure dissipating approximately 1000 to 5000 watts, such as depicted in FIGS. 1≅4. This is of course not meant to limit the invention in that other flow rates are perfectly acceptable. As stated above, other numbers of levels may be used in the invention. Using a towered cooling structure as defined herein, the preferred number of duct members is within the range from about two to about ten when each duct member is designed for providing cooling fluid to a singular corresponding level. As indicated, however, other combinations are readily possible in accordance with the unique teachings of the invention, primarily when more than one duct members are used per individual level. The preferred fan 41 for use of the invention may be obtained from the Torin Corporation, Torrington California, said fan generating approximately 1/20 to ¾ horsepower and is operational using normal line sources. Other means for generating fluid flow are also readily possible in the instant invention, including pumps. Gravity flow (of liquids) is also possible. The plenum 43 in which fan 41 is located may be connected to any suitable air source, including external. Additionally, various filtering means may be used to provide appropriate air filtration, provided these assure minimum air velocities of 200 feet per minute, such filtering means serving to prevent contaminants or similar undesirable elements from being directed onto the respective electronic components being cooled. Such filters are known and further description is not believed necessary.

Figure 6:
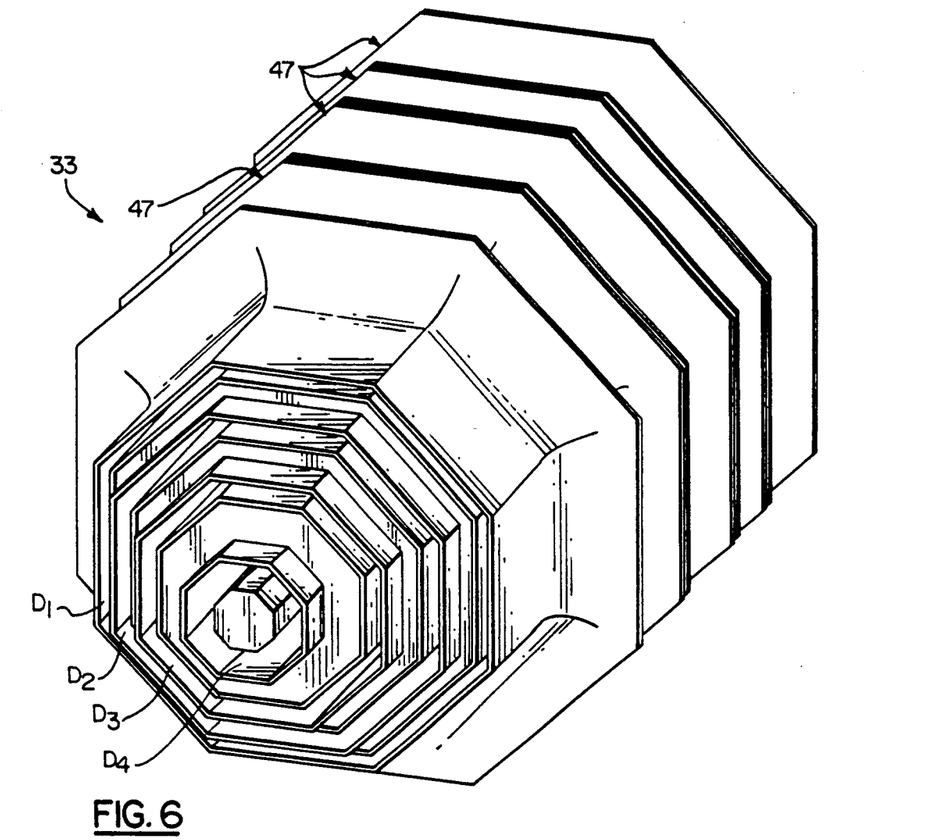
FIG. 6 is a perspective view of the bottom structure of the cooling means of FIG. 1.

As shown in FIG. 2, fan 41 is located immediately adjacent the bottom end of the multileveled cooling means 33 so as to direct air directly into open ended ducts D1-D4. This open ended portion of cooling means 33 is better seen in FIG. 6. The octagonal configuration for each of the end sections of the respective longitudinal chamber portions for each duct member is also more clearly depicted in FIG. 6. Comparing FIGS. 5 and 6, it is also seen that the duct members include common, double side walls which serve to define the longitudinal chamber portions and which terminate at the approximate ends of the flared end portions of the cooling means. These double walled portions of the invention are closed at the extreme ends thereof, as shown in FIG. 5 (and partially in FIG. 6). The internal duct D4 and the outermost duct D1 are shown only to include a singular side wall as one of the walls thereof. It is understood, however, that these duct members may also include double sidewalls to thus assure added reinforcement and rigidity to the final structure.

In a preferred embodiment of the invention the towered, concentrically oriented duct members are each comprised of plastic (e.g., a thermoplastic). Other materials, including metallic (e.g., aluminum or steel), are also possible.

Figure 7:
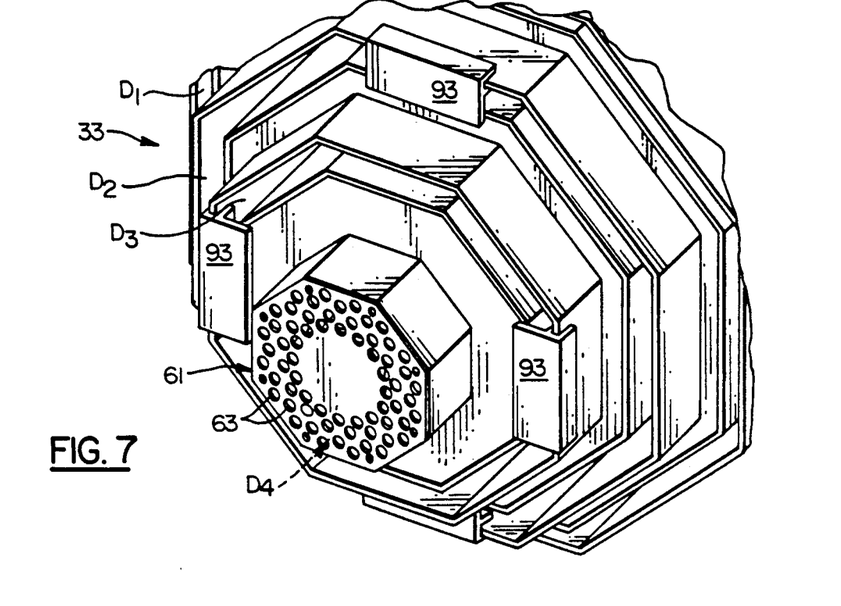
FIG. 7 is an alternate embodiment of the bottom structure for the cooling means of the invention, this structure including as part thereof diffuser means to provide even, turbulent fluid flow in one of the duct members of the cooling means.

In FIG. 7 there is shown a means for diffusing fluid as it passes through one of the duct members (e.g., D4) of cooling means 33. In FIG. 7, this diffusing means is shown as comprising an apertured plate member 61 sealed over the end of duct D4 (and thus immediately adjacent fan 41, not shown) such that fluid directed toward duct D4 will be diffused by virtue of it passing through the several spaced apart apertures located within the plate. This creates a plenum resulting in the passage of turbulent flow of fluid through duct member D4 to thereby substantially remove laminar, peaked flow as might occur within this duct if a source such as fan 41 is used. Such peaked output is typical in fan-generated flow and is thus overcome by the invention so that uniform, even flow results in each of the individual flared end sections of the respective duct members. Although only one fluid diffuser is shown in FIG. 7, it is understood that other diffusers, including baffles and those similar to the apertured plate version in FIG. 7, may be used for the remaining duct members D1–D3. Thus, all duct members may include the diffuser on the end thereof to provide the advantages cited above.

A diffuser plate may also be located between the fan and the lower duct openings to create uniform flow to the ducts. The distance between the fan and plate should be at least the diameter of the fan blade to allow the rotating airstream to dissipate into static pressure. It is also understood that other configurations for such diffusers may be used, including, for example, various vane configurations or similar deflectors strategically positioned relative to the duct opening (between the fan and such opening). Such members may also serve to "tune" to amount of fluid flow to each duct (e.g., a solid plate 93 located over a section of the respective duct opening, as in FIG. 7). Further description is thus not believed necessary.

Although a polygonal (octagonal) configuration for the assembly 11 (and thus the internally positioned cooling means) is shown in FIGS. 1–7, it is understood that other configurations are readily possible. For example, in FIG. 8, there is shown an annular version of the invention wherein each of the individual levels having substrates thereon is shown to be of substantially annular configuration. Each level, as in the case of levels "L" in the above embodiment in FIG. 1, is parallel to the other levels in the assembly. Also shown in FIG. 8, the resulting flared end portions of each of the towered cooling structure is also annular, as is the corresponding longitudinal chamber portions for each duct member.

In the embodiment of FIG. 9, a rectangular assembly is shown wherein a similarly configured, towered cooling structure is used. Thus, fluid is directed in four directions to four corresponding substrates adjacent each of the flared ends employed.

Figure 8:
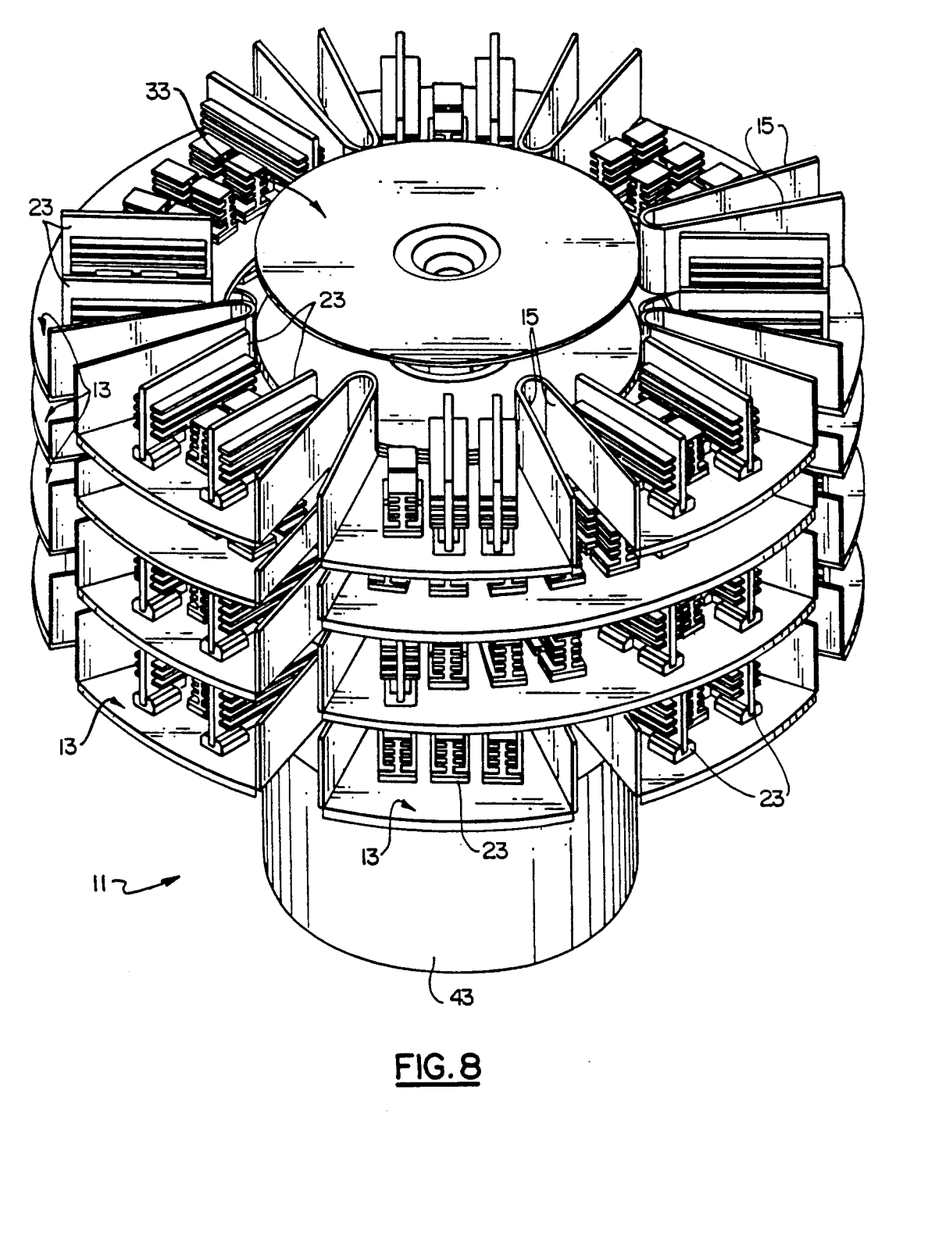
FIGS. 8 and 9 represent alternate embodiments of the invention, the view in FIG. 8 being an annular (cylindrical) version while the view in FIG. 9 represents a rectangular version.

In both of the embodiments of FIG. 8 and FIG. 9, a plenum 43 having the desired air generator (fan) therein is preferably used although, as stated, other means are readily possible.

As shown in FIG. 9, two flared end portions of the towered cooling means are used for at least one (the upper) of the levels of substrates (as also illustrated representatively is FIG. 5). Thus, two ducts are used in the embodiment of FIG. 9 to thereby provide differential fluid flow to the heat generating electronic components on this upper level. By the term differential fluid flow is meant that, for example, greater flow rates may be utilized through one of the paired duct members per level (e.g., at the top) to provide greater cooling at different levels within each substrate level. This arrangement substantially eliminates the creation of "hot spots" as may occur in substrate configurations as a result of close positioning of the heat generating components thereon. This represents yet another significant feature of the invention as described herein.

In FIGS. 1 and 3, there are shown (in phantom) wall members 81 (FIG. 1) and 83 (FIG. 3) which may be used to encase assembly 11 and, equally significant, to provide added means for fluid direction. In FIG. 1, for example, a wall 81 is shown as including a plurality of openings 85 therein which will permit fluid passage directly through wall 81, if desired. It is also understood that walls similar to wall 81 may totally surround and thus enclose assembly 11 and thus may form part thereof. Only one such wall is illustrated in FIG. 1, however, for illustration purposes. In FIG. 3, three such walls 83 are shown to better illustrate this relationship. In FIG. 3, walls 83 may be solid in configuration and thus serve to direct fluid infringing thereon in another direction (e.g., downward). Such downward flow is facilitated by the provision of slots or the like 91 (FIG. 9) within the outermost periphery of the respective substrates and thus immediately adjacent such a wall so as to provide a channel along the outer periphery of assembly 11 through which fluid may be directed. Such a channel is also shown in phantom as being possible within at least one of the substrates shown in FIG. 3. It is understood that this fluid as directed by such walls as already passed over the respective heat generating electronic components.

Thus there has been shown and described a multileveled electronic assembly wherein a highly efficient cooling means is used to provide cooling for the heat generating electronic components used therein. The assembly as defined is capable of being adequately cooled using a cooling means of relatively simple yet effective construction, and thus one which is relatively inexpensive to manufacture. Such a means, as defined, is particularly useful for directing air or similar gaseous medium to the various components being cooled, but may also be utilized to direct liquids (e.g., flourocarbons) therethrough.

While there have been shown and described what are at present considered the preferred embodiments of the invention, it will be obvious to those skilled in the art that various changes and modifications may be made therein without departing from the scope of the invention as defined by the appended claims.

What is claimed is:

1. In an multileveled electronic assembly including a plurality of spacedly positioned substrates located at different levels within said assembly and each including thereon a plurality of heat generating electronic components, said assembly including means to provide cooling of said electronic components, the improvement wherein said cooling means comprises a plurality of individual duct members centrally oriented within said assembly, each of said duct members directing cooling fluid onto said electronic components on a respective one of said substrates to cool said electronic components.

2. The improvement according to claim 1 wherein said plurality of duct members of said cooling means are coaxially oriented.

3. The improvement according to claim 2 wherein said levels of said substrates surround said centrally oriented cooling means.

4. The improvement according to claim 3 wherein said electronic assembly is a supercomputer.

5. The improvement according to claim 1 wherein each of said duct members comprises a longitudinal chamber portion and a flared end portion, each of said flared end portions being located within said assembly adjacent each of said respective substrates having said electronic components thereon 6. The improvement according to claim 5 wherein each of said flared end portions of said cooling means is substantially annular in shape.

7. The improvement according to claim 5 wherein each of said flared end portions of said cooling means is of polygonal shape to thereby direct cooling fluid passing through said duct means in a plurality of directions.

8. The improvement according to claim 7 wherein the shape of each of said flare portions of said cooling means is rectangular, the number of directions said fluid is directed being four.

9. The improvement according to claim 7 wherein the shape of each of said flare portions of said cooling means is octagonal, the number of directions said fluid is directed being eight.

10. The improvement according to claim 1 wherein the number of said duct members is within the range of from about two to about ten.

11. The improvement according to claim 1 wherein each of said duct members is joined to a common plenum member, said plenum including means for generating flow of said fluid therein.

12. The improvement according to claim 11 wherein said means for generating said flow of said fluid within said plenum comprises a fan.

13. The improvement according to claim 12 further including means for diffusing said fluid generated by said generating means prior to said fluid entering at least one of said duct members to thereby provide turbulent, even flow of said fluid to said duct member receiving said fluid.

14. The improvement according to claim 13 wherein said means for diffusing said fluid comprises an apertured plate member located substantially across said duct member, said plate member including a plurality of spacedly oriented apertures therein.

15. The improvement according to claim 1 wherein the number of said duct members directing fluid onto at least one of said levels of said substrates is at least two, said two duct members directing fluid to said one level thereby providing differential fluid flow across said electronic components located on said substrates on said one level.

16. The improvement according to claim 1 wherein said individual duct members are each comprised of plastic material.

17. The improvement according to claim 16 wherein said plastic material is a thermoplastic.

18. The improvement according to claim 1 further including wall members located adjacent each of said levels of substrates along the outer periphery thereof to assist in directing said fluid directed over said electronic components after said fluid has passed over said components.

19. The improvement according to claim 18 wherein each of said walls includes a plurality of openings therein for having said fluid passing over said components pass therethrough.

* * * * *